US012801816B2

(12) United States Patent
Kitamura et al.

(10) Patent No.: US 12,801,816 B2
(45) Date of Patent: Nov. 17, 2026

(54) SUPPORT APPARATUS AND METHOD FOR SUPPORTING EDITING OF ELECTRIC CIRCUIT

(71) Applicant: Kabushiki Kaisha Zuken, Kanagawa (JP)

(72) Inventors: Koichi Kitamura, Kanagawa (JP); Katsuyoshi Ikuta, Kanagawa (JP)

(73) Assignee: Kabushiki Kaisha Zuken, Kanagawa (JP)

( * ) Notice: Subject to any disclaimer, the term of this patent is extended or adjusted under 35 U.S.C. 154(b) by 712 days.

(21) Appl. No.: 18/456,616

(22) Filed: Aug. 28, 2023

(65) Prior Publication Data

US 2023/0409787 A1 Dec. 21, 2023

Related U.S. Application Data

(63) Continuation of application No. PCT/JP2021/008181, filed on Mar. 3, 2021.

(51) Int. Cl.
*G06F 30/31* (2020.01)

(52) U.S. Cl.
CPC .................................... *G06F 30/31* (2020.01)

(58) Field of Classification Search
CPC ....................................................... G06F 30/31
USPC .......................................................... 716/139
See application file for complete search history.

(56) References Cited

U.S. PATENT DOCUMENTS

| | | | | |
|---|---|---|---|---|
| 9,208,277 | B1 * | 12/2015 | Lamant | G06F 30/392 |
| 2010/0205575 | A1 | 8/2010 | Arora et al. | |

FOREIGN PATENT DOCUMENTS

| | | | |
|---|---|---|---|
| JP | H04-165649 A | | 6/1992 |
| JP | 2018-200625 A | | 12/2018 |
| WO | 2016-151834 A1 | | 9/2016 |

OTHER PUBLICATIONS

International Search Report ("ISR") issued on Apr. 27, 2021 in parent PCT Appln. No. PCT/JP2021/008181.
International Preliminary Report on Patentability ("IPRP") issued on Apr. 5, 2023 in parent PCT Appln. No. PCT/JP2021/008181.

* cited by examiner

*Primary Examiner* — Eric D Lee
(74) *Attorney, Agent, or Firm* — Venable LLP

(57) ABSTRACT

An editing support apparatus for supporting editing of an electric circuit, includes a first converter configured to convert an operation on a contact type input device into a first command, a second converter configured to convert a voice signal into a second command, and an editing unit configured to update the electric circuit in accordance with the first command and the second command. The editing unit updates a conductive path that forms a part of the electric circuit in accordance with the second command provided from the second converter when editing the conductive path.

20 Claims, 15 Drawing Sheets

FIG. 6

| CHANGE LAYER ACCORDING TO LAYER CHANGE COMMAND | |
|---|---|
| CURRENT LAYER | LAYER AFTER CHANGE |
| FIRST LAYER | THIRD LAYER |
| SECOND LAYER | FIFTH LAYER |
| THIRD LAYER | FIRST LAYER |
| FOURTH LAYER | SEVENTH LAYER |
| FIFTH LAYER | SECOND LAYER |
| SIXTH LAYER | THIRD LAYER |
| SEVENTH LAYER | FOURTH LAYER |

SUPPORT APPARATUS AND METHOD FOR SUPPORTING EDITING OF ELECTRIC CIRCUIT

CROSS-REFERENCE TO RELATED APPLICATION(S)

This application is a continuation of International Patent Application No. PCT/JP2021/008181 filed on Mar. 3, 2021, the entire disclosures of which is incorporated herein by reference.

BACKGROUND OF THE INVENTION

Field of the Invention

The present invention relates to a design support apparatus and a design support method.

Description of the Related Art

When designing the electric circuit of a PCB (Printed Circuit Board) or the like using a design support apparatus such as a CAD (Computer-Aided Design) apparatus, most of works is editing of a conductive path. When editing a conductive path including a plurality of linear sections, for example, the plurality of linear sections are sequentially determined using a pointing device. At this time, to change the width of the conductive path halfway through it, it is necessary to move a cursor (pointer) from the editing position of the conductive path to a numerical value input field, input a numerical value using a keyboard and press an enter key, and return the cursor to the original position using the pointing device. Such a work is very inefficient. Note that the work described here is merely an example, and a current conductive path editing work includes various inefficient works.

SUMMARY OF INVENTION

The present invention provides a technique advantageous in efficiently editing a conductive path.

One of aspects of the present invention provides an editing support apparatus for supporting editing of an electric circuit, comprising: a first converter configured to convert an operation on a contact type input device into a first command; a second converter configured to convert a voice signal into a second command; and an editing unit configured to update the electric circuit in accordance with the first command and the second command, wherein the editing unit updates a conductive path that forms a part of the electric circuit in accordance with the second command provided from the second converter when editing the conductive path.

Other features and advantages of the present invention will be apparent from the following description taken in conjunction with the accompanying drawings. Note that the same reference numerals denote the same or like components throughout the accompanying drawings.

BRIEF DESCRIPTION OF DRAWINGS

The accompanying drawings, which are incorporated in and constitute a part of the specification, illustrate embodiments of the invention and, together with the description, serve to explain principles of the invention.

FIG. 6 is a table showing the relationship between a current layer and a layer (another layer) after change at the time of execution of a layer change command;

DESCRIPTION OF EMBODIMENTS

Figure 1:
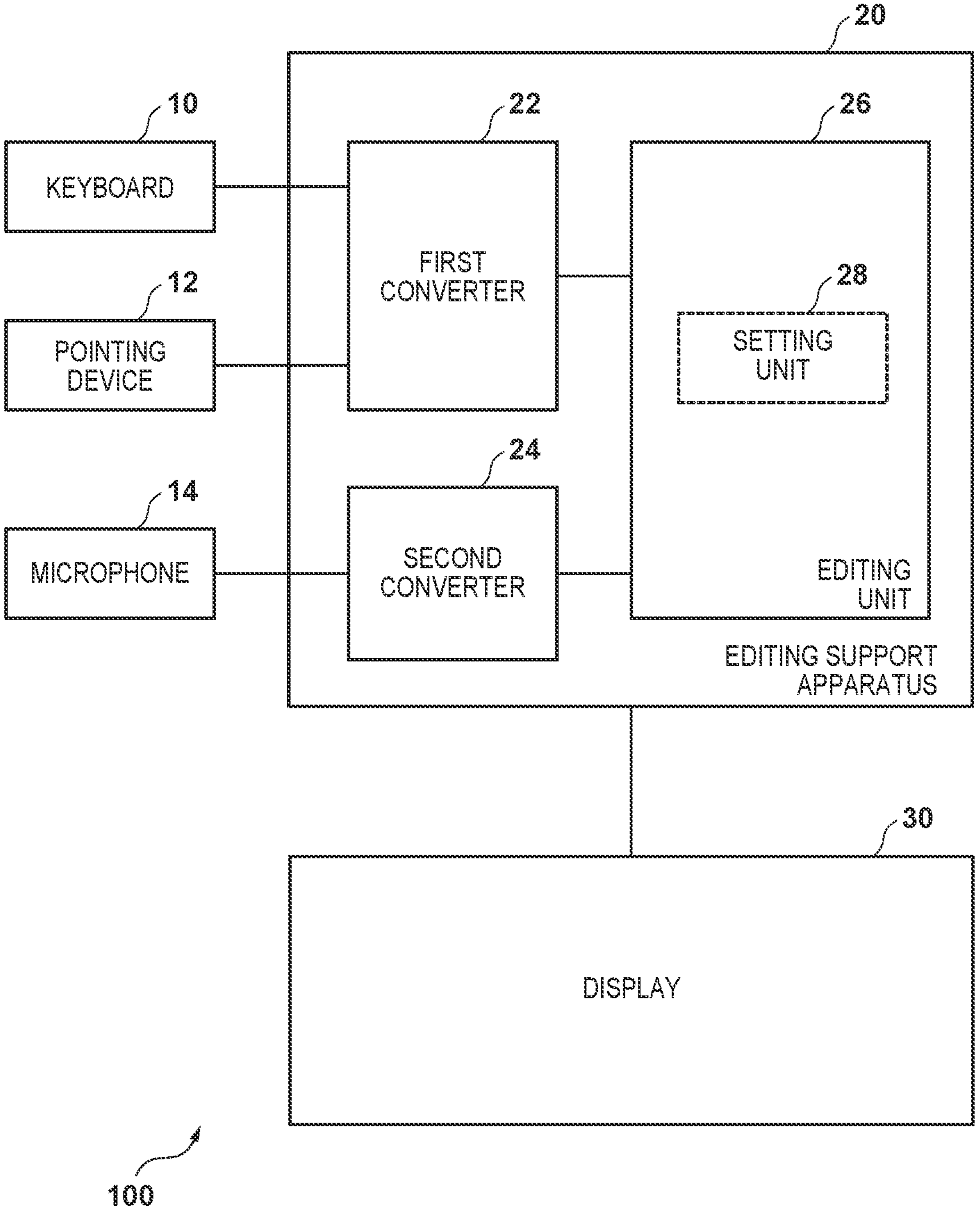
FIG. 1 is a block diagram showing the configuration of a computer system according to an embodiment.

Hereinafter, embodiments will be described in detail with reference to the attached drawings. Note, the following embodiments are not intended to limit the scope of the claimed invention, and limitation is not made to an invention that requires a combination of all features described in the embodiments. Two or more of the multiple features described in the embodiments may be combined as appropriate. Furthermore, the same reference numerals are given to the same or similar configurations, and redundant description thereof is omitted.

FIG. 1 shows the configuration of a computer system 100 according to an embodiment. The computer system 100 can include, for example, an editing support apparatus 20, a keyboard 10, a pointing device 12, a microphone 14, and a display 30. Some or all of the keyboard 10, the pointing device 12, the microphone 14, and the display 30 may be understood as the constituent elements of the editing support apparatus 20.

The keyboard 10 and the pointing device 12 are examples of a contact type input device. The contact type input device is a device configured to input information (including a command) by a user bringing a part of his/her body into direct or indirect contact with it. The indirect contact can include, for example, contact via an article such as a glove or clothing that the user wears or contact using a tool such as a pen. The pointing device 12 can include, for example, a mouse or a touch pad. The microphone 14 is a device that inputs a voice signal.

The editing support apparatus 20 can be constituted by installing an editing support program or a design support tool, which is a computer program, in a general-purpose or dedicated computer including a CPU (processor), a memory, and the like. The editing support program or the design support tool can constitute the present invention by itself. In addition, a computer-readable medium (a disk such as a CD or a DVD or a nonvolatile memory medium) storing the editing support program or the design support tool can also constitute the present invention. In a case where some or all of the components of the editing support apparatus 20 are placed in or outside a country or a region where the present application is filed, and a computer placed in the country or the region where the present application is filed is operated substantially or virtually as the editing support apparatus 20, the computer can be interpreted as the editing support apparatus 20.

The editing support apparatus 20 can be configured to support editing of an electric circuit of a PCB (Printed Circuit Board) or a semiconductor device. The editing support apparatus 20 can include, for example, a first converter 22, a second converter 24, and an editing unit 26. The first converter 22 can convert an operation by the user for the keyboard 10 and the pointing device 12, which are examples of a contact type input device, into a first command and provide it to the editing unit 26. The first command is information for causing the editing unit 26 or the editing support apparatus 20 to execute a certain operation and can include, for example, a numerical value and/or a character. In another viewpoint, the first converter 22 can convert information or a signal provided from the keyboard 10 and the pointing device 12 into the first command and provide it to the editing unit 26.

The second converter 24 can convert a voice signal provided from the user via the microphone 14 into a second command and provide it to the editing unit 26. In another viewpoint, the second converter 24 can convert a voice signal provided from the microphone 14 into the second command and provide it to the editing unit 26. The second command is information for causing the editing unit 26 or the editing support apparatus 20 to execute a certain operation and can include, for example, a numerical value and/or a character.

The first command and the second command may each include a main command that starts execution of a certain operation and one or a plurality of sub commands associated with that, and may further include an end command that ends the operation whose execution is started by the main command.

Under the control of the editing unit 26, the display 30 can display, for example, information that visualizes an electric circuit (electric circuit data) under editing, and information for editing (for example, a command menu).

The editing unit 26 can update the electric circuit (electric circuit data) in accordance with the first command provided from the first converter 22 and the second command provided from the second converter 24. The editing unit 26 can be configured to, for example, update the conductive path in accordance with the second command provided from the second converter 24 when editing a conductive path that forms a part of the electric circuit.

The editing unit 26 may include a setting unit 28 configured to, when executing a layer change command that instructs layer change for connecting a conductive path from a current layer to another layer through a via, set the other layer. FIG. 6 shows the relationship between a current layer and a layer (another layer) after change at the time of execution of the layer change command. The setting unit 28 can be configured to, when executing the layer change command that instructs layer change for connecting a conductive path from a current layer to another layer through a via, set the other layer in accordance with the first command. Alternatively, the setting unit 28 can be configured to, when executing the layer change command that instructs layer change for connecting a conductive path from a current layer to another layer through a via, set the other layer in accordance with the second command. Alternatively, the setting unit 28 can be configured to, when executing the layer change command that instructs layer change for connecting a conductive path from a current layer to another layer through a via, set the other layer in accordance with the first command, and the setting unit 28 can be configured to, when executing the layer change command that instructs layer change for connecting a conductive path from a current layer to another layer through a via, set the other layer in accordance with the second command.

In the example shown in FIG. 6, in a case where the layer change command is input at the time of editing of the first layer (an example in which the current layer is the first layer), the editing unit 26 can generate a via from the first layer to the third layer and change the editing target layer from the first layer to the third layer. The layer change command can be generated as the first command, that is, by the first converter 22 in accordance with an operation of the keyboard 10 or the pointing device 12. In an example, the layer change command can be generated by double-clicking the pointing device 12. In another example, the layer change command can be generated by selecting one command, using the pointing device 12, from a command menu displayed on the display 30. The layer change command may be generated as the second command, that is, by the second converter 24 in accordance with input of a voice signal to the microphone 14.

To cause the computer to operate as the editing support apparatus 20 including the first converter 22, the second converter 24, and the editing unit 26, the above-described editing support program or design support tool can include a first conversion sub-program, a second conversion sub-program, and an updating sub-program corresponding to the first converter 22, the second converter 24, and the editing unit 26, respectively.

The editing support apparatus 20 or the computer system 100 can execute an editing support method for supporting editing of an electric circuit. The editing support method can include, for example, a command receiving step and an updating step. The command receiving step can be a step of receiving the first command and the second command from the first converter 22 that converts an operation on the contact type input device into the first command and the second converter 24 that converts a voice into the second command. The updating step can be a step of updating the electric circuit in accordance with the first command and the second command. In the updating step, the conductive path can be updated in accordance with the second command provided from the second converter 24 when editing a conductive path that forms a part of the electric circuit.

Figure 2:
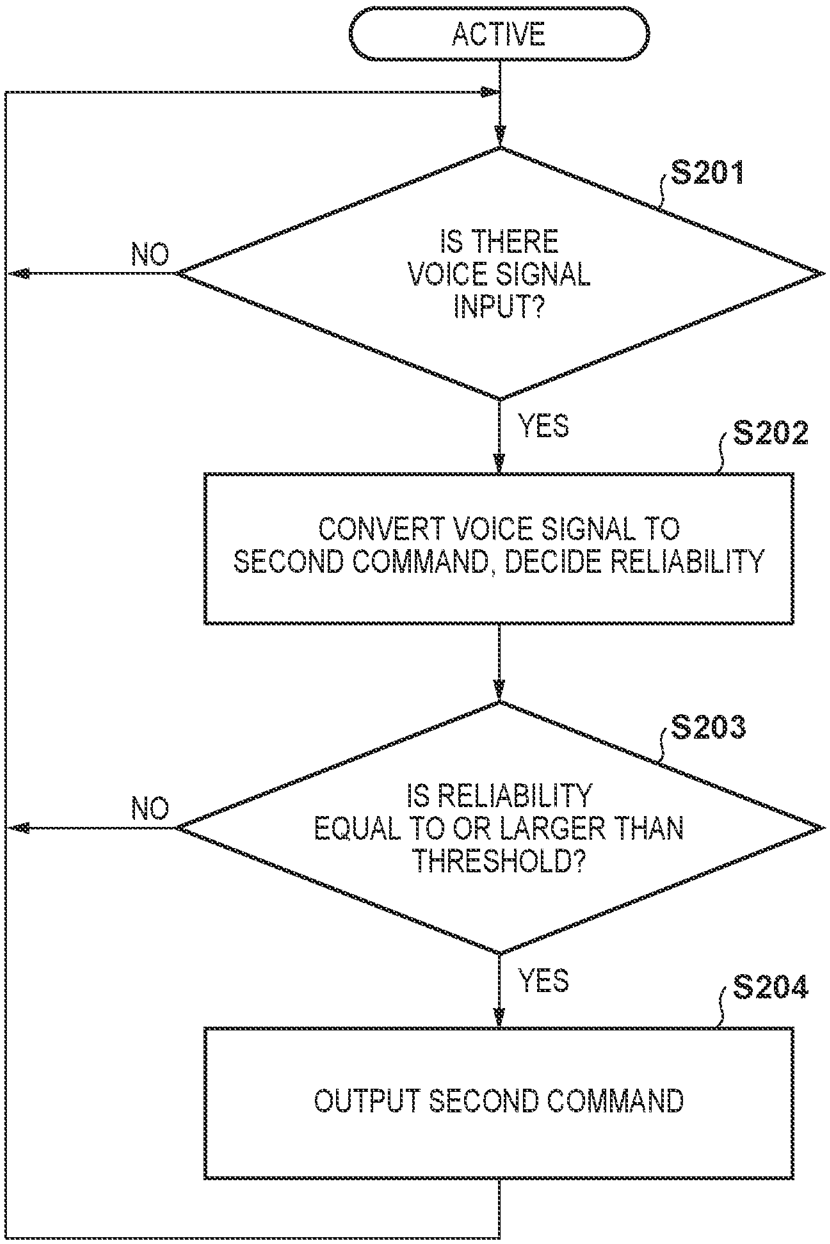
FIG. 2 is a flowchart showing the operation of a second converter.

FIG. 2 shows the operation of the second converter 24. The operation shown in FIG. 2 is started by activating it.

Activation of the second converter 24 can be done by, for example, inputting a command to start voice input as the first command. Alternatively, activation of the second converter 24 can be done in response to activation of the editing support apparatus 20.

In step S201, the second converter 24 judges whether a voice signal is input from the microphone 14. In a case where a voice signal is input, the process advances to step S202. In step S202, the second converter 24 can convert the voice signal input from the microphone 14 into the second command and decide the reliability (likelihood) of the second command. In step S203, the second converter 24 judges whether the reliability decided in step S202 is equal to or larger than a preset threshold. In a case where the reliability is equal to or larger than the threshold, the process advances to step S204. Otherwise, the process returns to step S201. In step S204, the second converter 24 provides or outputs the second command converted in step S202 to the editing unit 26. The operation of the second converter 24 shown in FIG. 2 is merely an example, and the second converter 24 may be made simpler or more complex. In addition, a learning function may be incorporated in the second converter 24. Note that to convert a voice signal into a text, select an intended command from the text, and calculate the reliability of the selection result, for example, "Speech to Text" and "Language Understanding (LUIS)" of Azure provided by Microsoft can be used.

Figure 3:
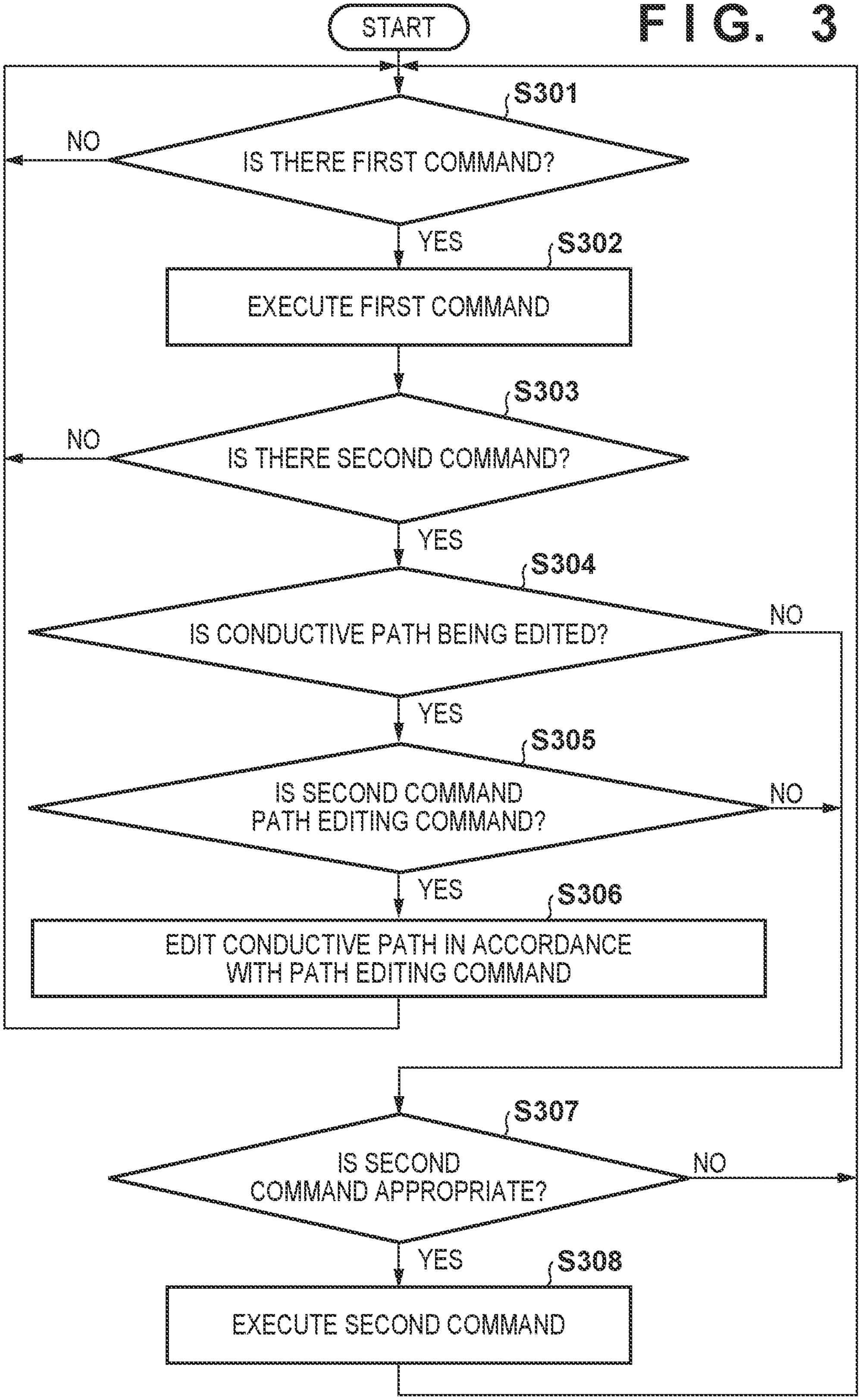
FIG. 3 is a flowchart showing the operation of an editing unit.

FIG. 3 shows the operation of the editing unit 26. In step S301, the editing unit 26 judges whether the first command is input from the first converter 22. In a case where the first command is input, the process advances to step S302. Otherwise, step S301 is repeated. The first command can be, for example, a wiring command that instructs the start of generation of a conductive path (wiring). Alternatively, the first command can be a layer change command that changes the current editing target layer to another layer. The first command can be a setting command that instructs setting by the setting unit 28. Alternatively, the first command can be a part arrangement command that instructs to arrange a part. In step S302, the editing unit 26 executes the first command input in step S301. The first command can be or cannot be completed by one execution in step S302. The wiring command is an example of the latter case. The first command may be an end command that instructs the end of the already executed wiring command. The first command can be a command selected, using the pointing device 12, from a command menu displayed on the display 30.

In step S303, the editing unit 26 judges whether the second command is input. In a case where the second command is input, the process advances to step S304. Otherwise, the process returns to step S301.

In step S304, the editing unit 26 judges whether a conductive path is being edited, that is, a path editing command (wiring command) is being executed. In a case where a conductive path is being edited, the process advances to step S305. Otherwise, the process advances to step S307. In step S305, the editing unit 26 judges whether the second command input in step S303 is the path editing command concerning editing of the conductive path. In a case where the second command is the path editing command, the process advances to step S306. Otherwise, the process advances to step S307. Here, advancing to step S306 means that the conductive path is being edited at the current time, and the second command input in step S303 is the path editing command.

In step S306, the editing unit 26 updates the conductive path in accordance with the path editing command that is the second command input in step S303. That is, in a case where the conductive path is being edited, and the second command is the path editing command concerning editing of the conductive path, in step S306, the editing unit 26 updates the conductive path in accordance with the path editing command.

In step S307, the editing unit 26 judges whether the second command is an appropriate command. In a case where the second command is an appropriate command, the second command is executed in step S308. For example, a second command that instructs to arrange an object during editing of a conductive path is an inappropriate command. In other words, in a case where execution of the second command is contradictory to the current editing work, the second command is an inappropriate command.

Figure 4:
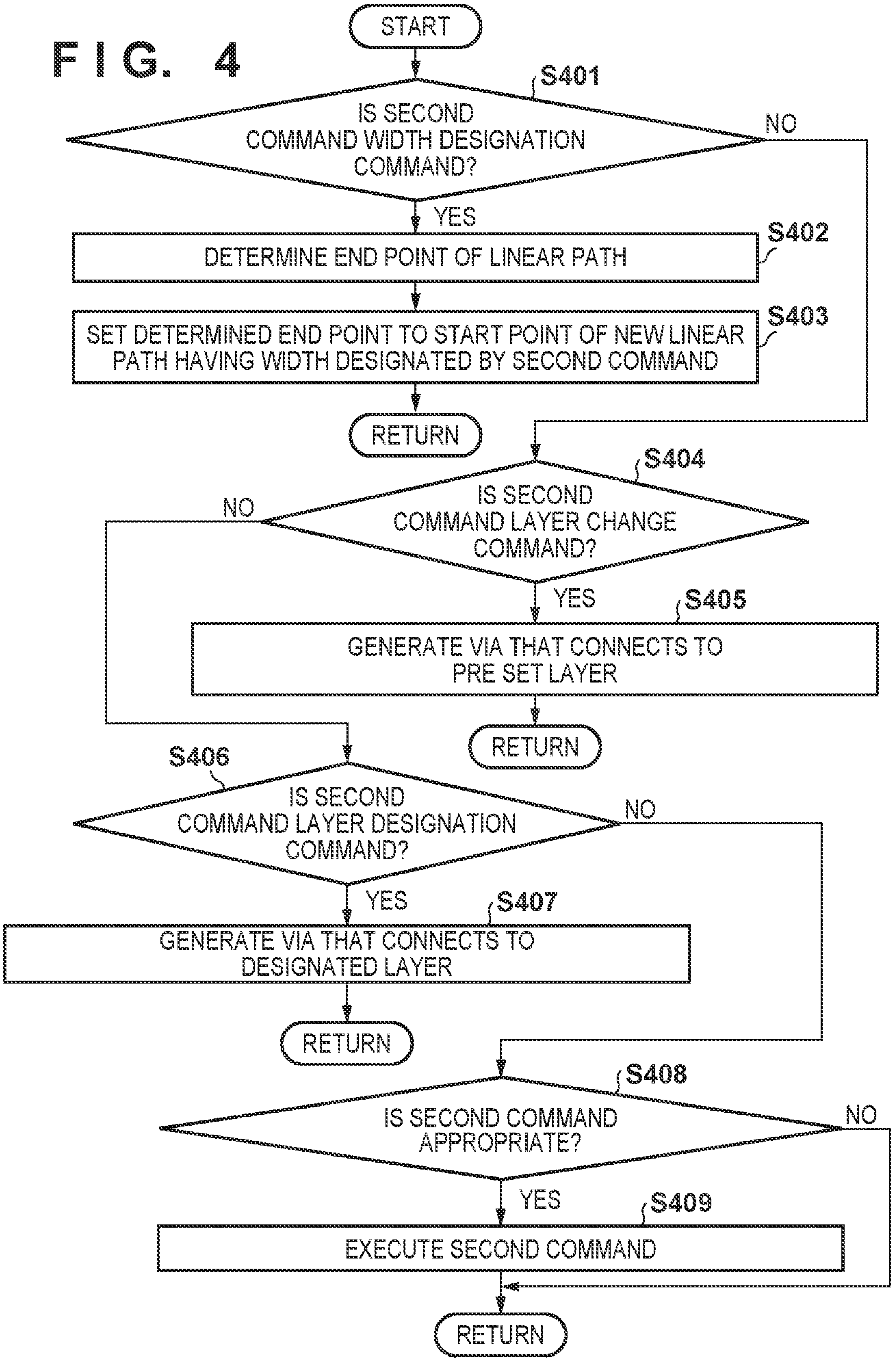
FIG. 4 is a flowchart showing detailed processing of step S306 in FIG. 3.
Figure 7:
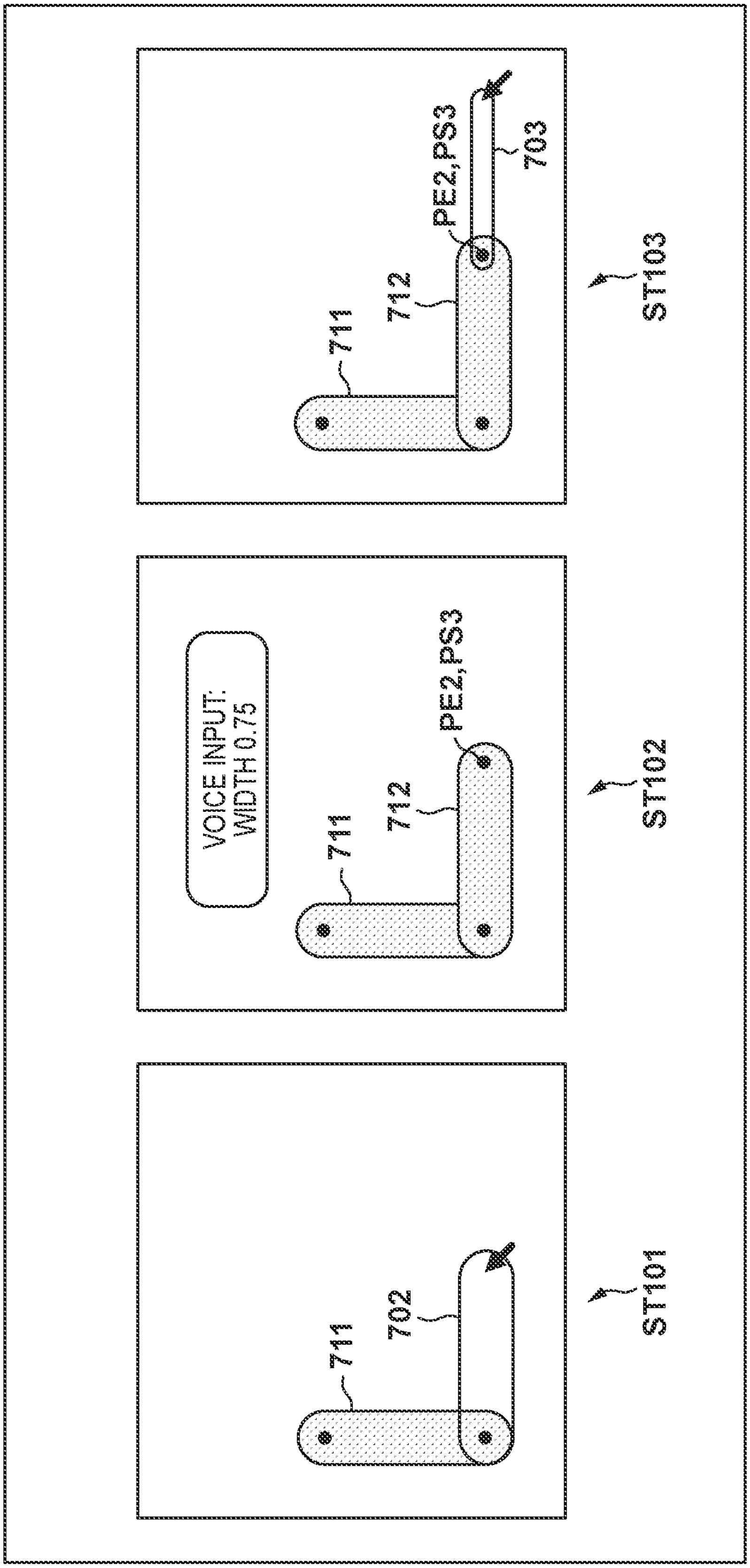
FIG. 7 is a view showing an editing work for generating a conductive path in accordance with input of a wiring command that instructs the start of generation of a conductive path.

FIG. 4 shows a detailed example of processing of step S306 in FIG. 3. In step S401, the editing unit 26 judges whether the second command input in step S303 (the second command judged to be the path editing command in step S305) is a width designation command that designates the width of the conductive path. In a case where the second command is the width designation command, the process advances to step S402. Otherwise, the process advances to step S404. In step S402, the editing unit 26 updates the conductive path in accordance with the width designation command. Here, the conductive path can be formed by a plurality of linear paths (sections). In a case where the width designation command that is the second command is provided in a state in which a linear path forming the conductive path is drawn with a certain width from a start point in accordance with a path variable command that is the first command, the editing unit 26 can determine the end point of the linear path in step S402, and set the end point to the start point of a new linear path having a width designated by the width designation command in step S403. In this case, as the new start point, a new linear path having the width designated by the width designation command begins to be drawn in accordance with the first command. This processing is shown in FIG. 7 to be described later. After that, the editing unit 26 returns to step S301 of FIG. 3.

Figure 8:
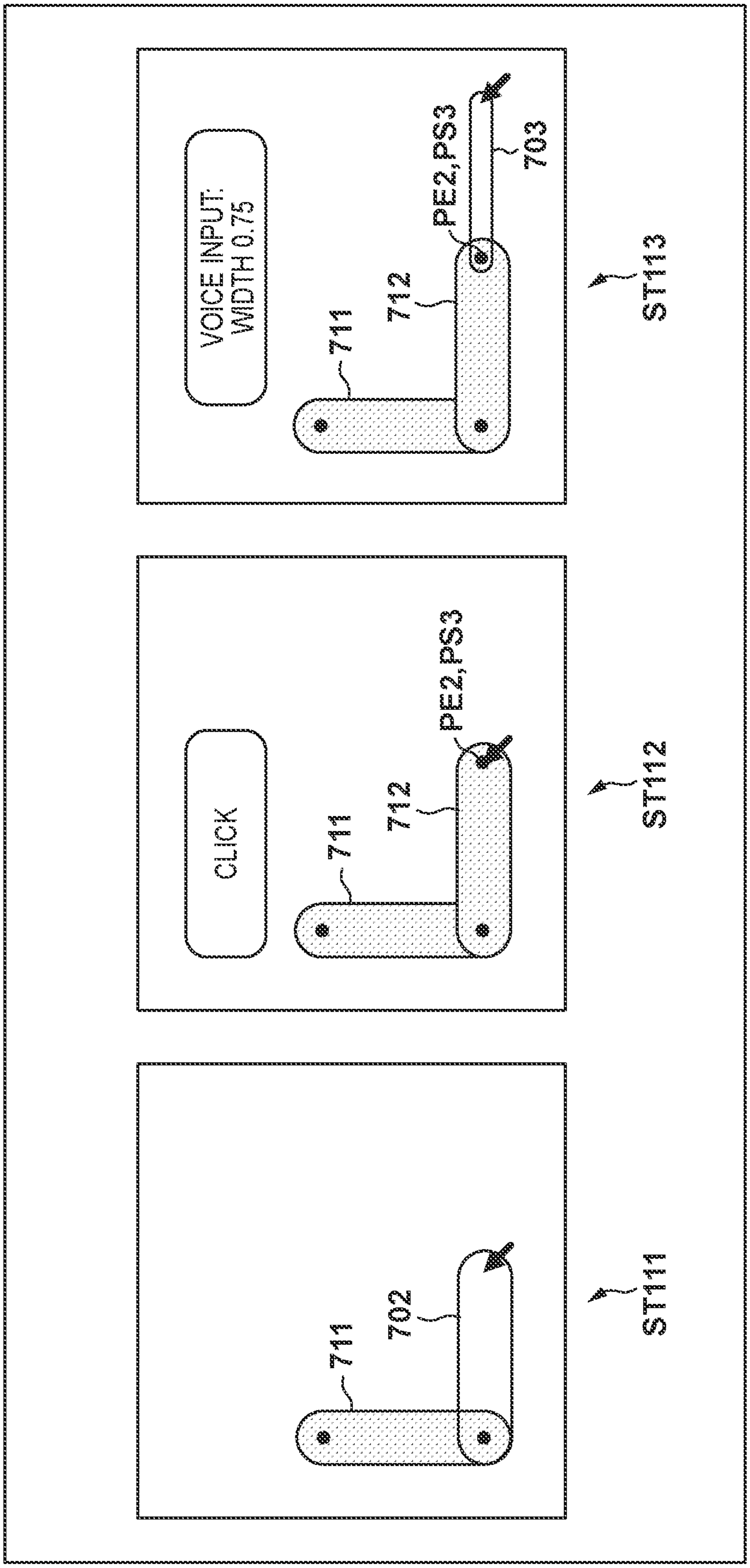
FIG. 8 is a view showing an editing work for generating a conductive path in accordance with input of a wiring command that instructs the start of generation of a conductive path.

Unlike the above-described processing, there can also be a case where after the linear path forming the conductive path begins to be drawn from the start point with a certain width in accordance with the first command in step S302, the second command is not input concerning the editing of the linear path, the first command is generated in accordance with, for example, a click on the pointing device 12 again in step S301, and the end point of the linear path is determined in accordance with the first command. After that, in a case where the width designation command that is the second command is input in step S303, the process can reach step S306 via steps S304 and S305 and further reach step S402 via step S401. In this case, the process can skip execution of step S402 and advance to step S403. In step S403, the end point can be set to the start point of the new linear path having the width designated by the width designation command. In this case, as the new start point, the new linear path having the width designated by the width designation command begins to be drawn in accordance with the first command. This processing is shown in FIG. 8 to be described later.

In step S404, the editing unit 26 judges whether the second command (the second command judged to be a path editing command in step S305) input in step S303 is the layer change command that instructs layer change for connecting from the current layer to another layer through a via. In a case where the second command is the layer change command, the process advances to step S405. Otherwise, the process advances to step S406.

Figure 9:
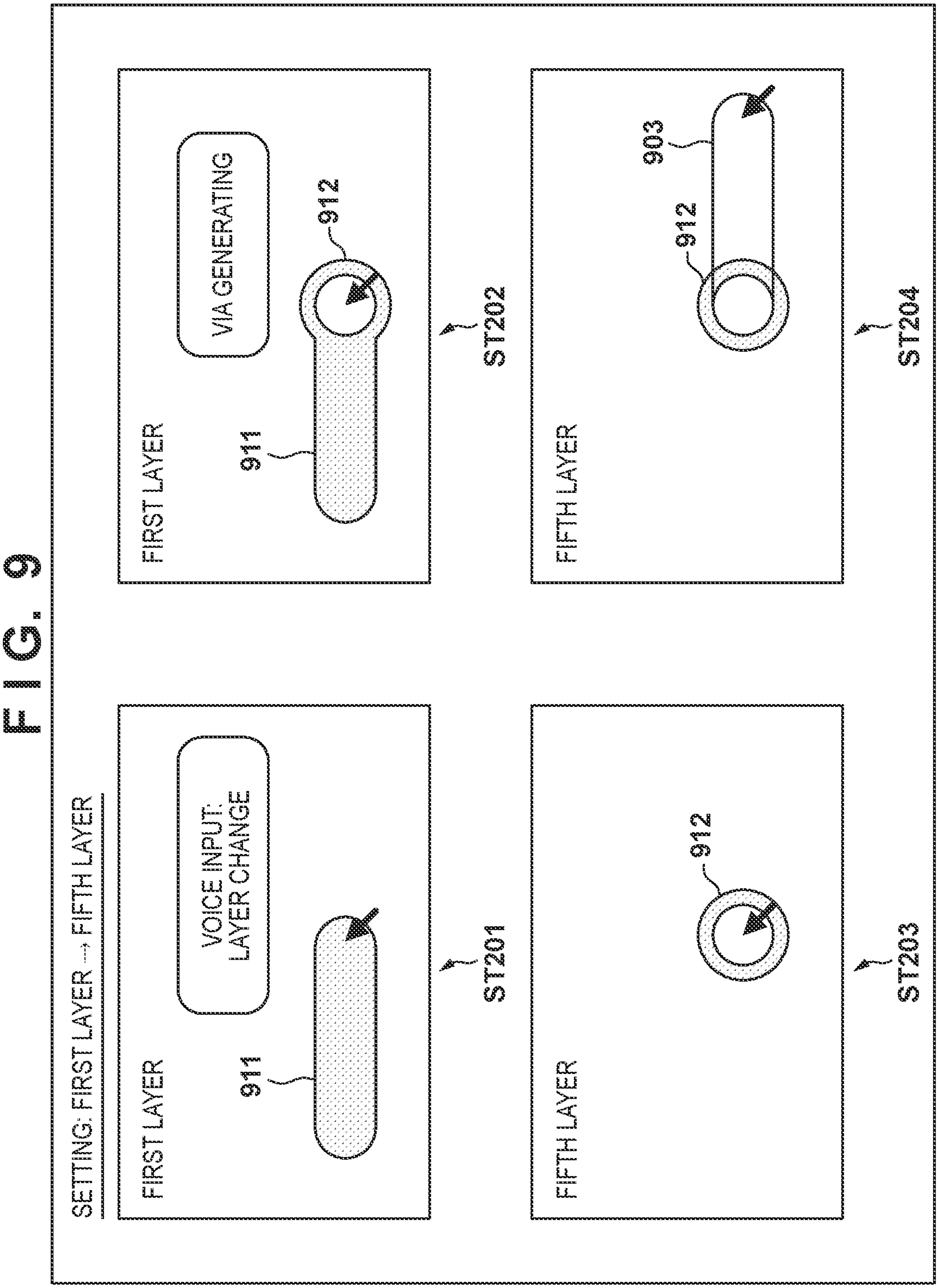
FIG. 9 is a view showing an editing work for generating a conductive path in accordance with input of a wiring command that instructs the start of generation of a conductive path.

In step S405, the editing unit 26 updates the conductive path such that the conductive path is connected from the current layer, through a via, to another layer (see FIG. 6) set by the setting unit 28. That is, in a case where the conductive path is being edited, and the layer change command that instructs layer change for connecting the conductive path from the current layer to another layer through a via is input, the editing unit 26 updates the conductive path such that the conductive path is connected from the current layer, through a via, to another layer set by the setting unit 28. This processing is shown in FIG. 9 to be described later. After that, the editing unit 26 returns to step S301 of FIG. 3.

In step S406, the editing unit 26 judges whether the second command (the second command judged to be a path editing command in step S305) input in step S303 is a layer designation command that designates a layer different from the current layer. In a case where the second command is the layer designation command, the process advances to step S407. Otherwise, the process advances to step S408.

Figure 10:
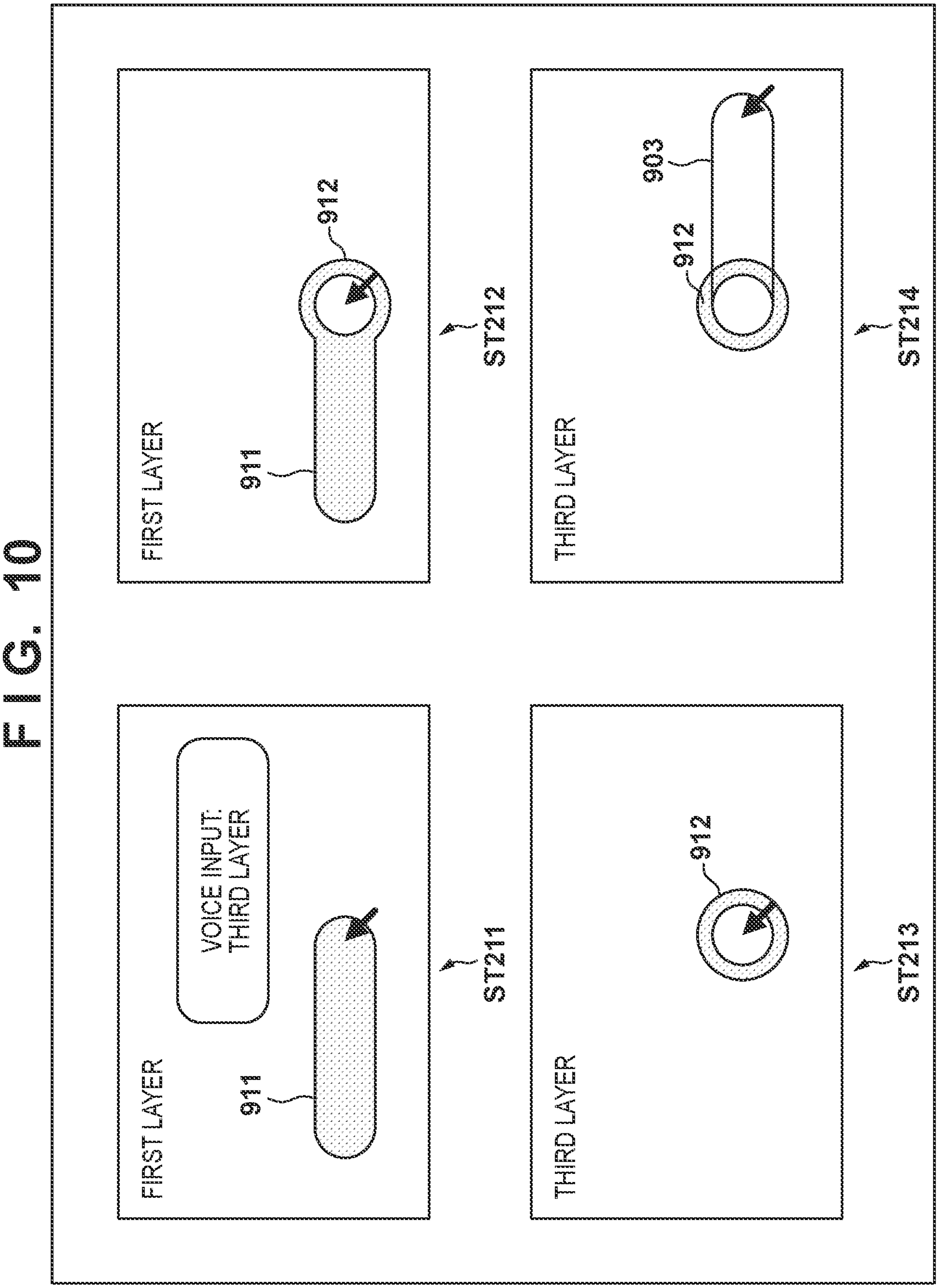
FIG. 10 is a view showing an editing work for generating a conductive path in accordance with input of a wiring command that instructs the start of generation of a conductive path.

In step S407, the editing unit 26 updates the conductive path such that the conductive path is connected from the current layer, through a via, to the layer designated by the layer designation command. That is, in a case where the conductive path is being edited, and the second command is the layer designation command that designates a layer different from the current layer, the editing unit 26 updates the conductive path such that the conductive path is connected from the current layer, through a via, to the layer designated by the layer designation command. This processing is shown in FIG. 10 to be described later. After that, the editing unit 26 returns to step S301 of FIG. 3.

In step S408, the editing unit 26 judges whether the second command as the layer change command is an appropriate command. In a case where the second command is an appropriate command, the second command is executed in step S409.

Figure 5:
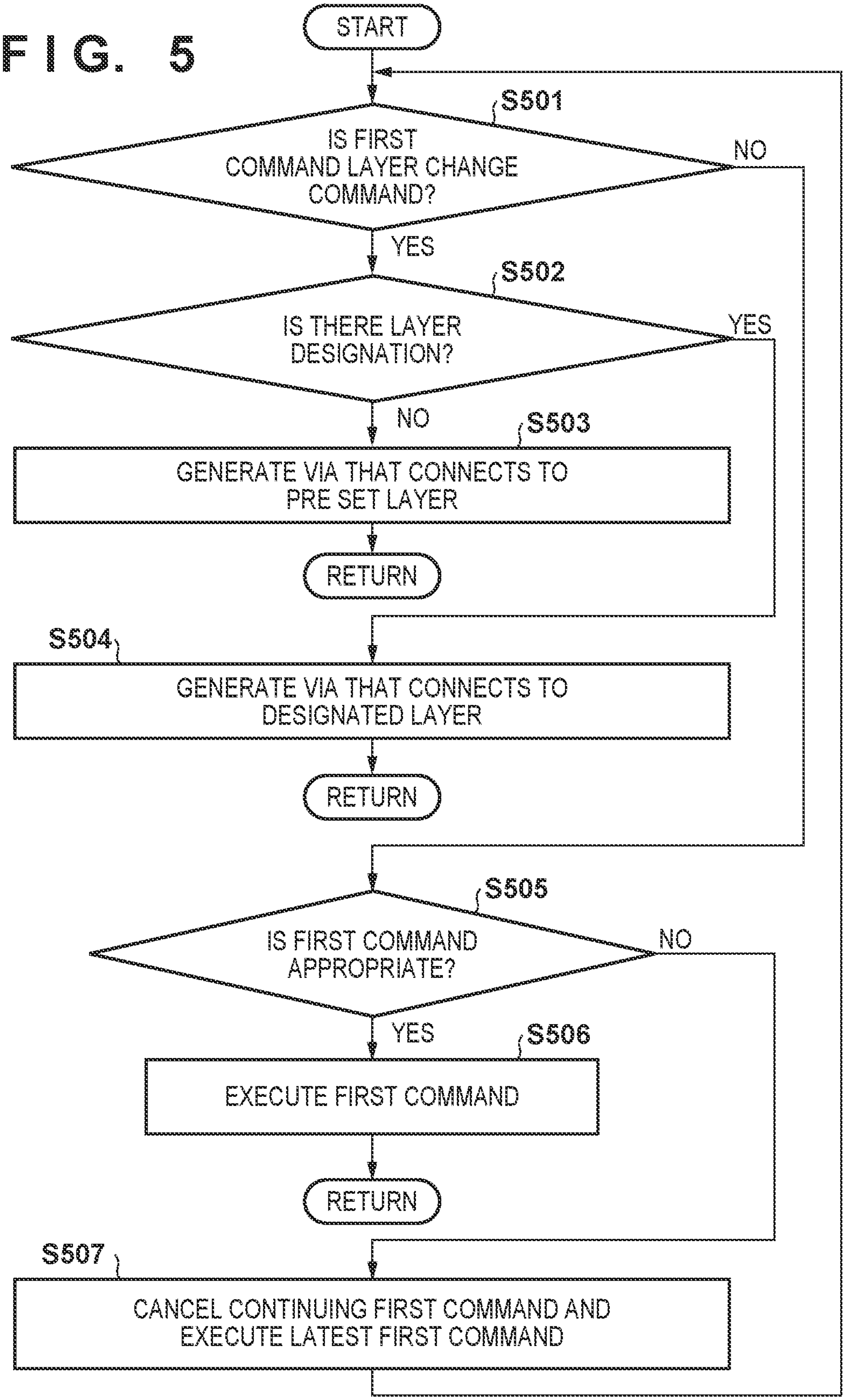
FIG. 5 is a flowchart showing detailed processing of step S302 in FIG. 3.

FIG. 5 shows a detailed example of processing of step S302 in FIG. 3. In step S501, the editing unit 26 judges whether the first command input in step S301 is the layer change command that instructs layer change for connecting from the current layer to another layer through a via. In a case where the first command is the layer change command, the process advances to step S502. Otherwise, the process advances to step S505. The layer change command that can be given as the first command can be generated by the first converter 22 in accordance with, for example, a double click on the pointing device 12.

In step S502, the editing unit 26 judges whether a destination layer (the layer of the destination to be connected through a via) is designated by the second command. In a case where the destination is not designated, the process advances to step S503. Otherwise, the process advances to step S504.

Figure 11:
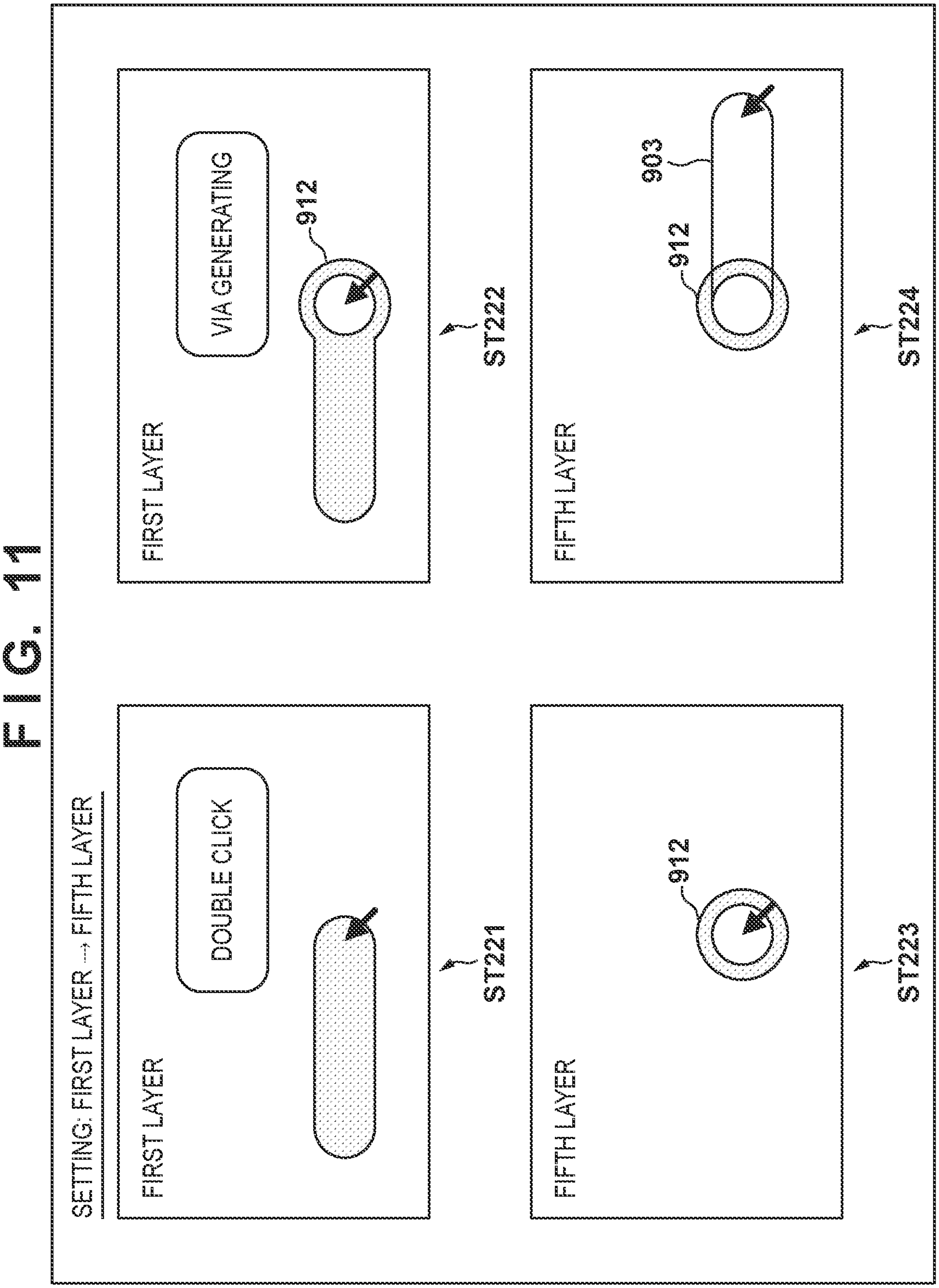
FIG. 11 is a view showing an editing work for generating a conductive path in accordance with input of a wiring command that instructs the start of generation of a conductive path.

In step S503, the editing unit 26 updates the conductive path such that the conductive path is connected from the current layer, through a via, to another layer (see FIG. 6) set by the setting unit 28. That is, in a case where the layer change command is input, and the layer of the destination is not designated by the second command, the editing unit 26 updates the conductive path such that the conductive path is connected from the current layer, through a via, to another layer set by the setting unit 28. This processing is shown in FIG. 11 to be described later. After that, the editing unit 26 advances to step S303 of FIG. 3.

Figure 12:
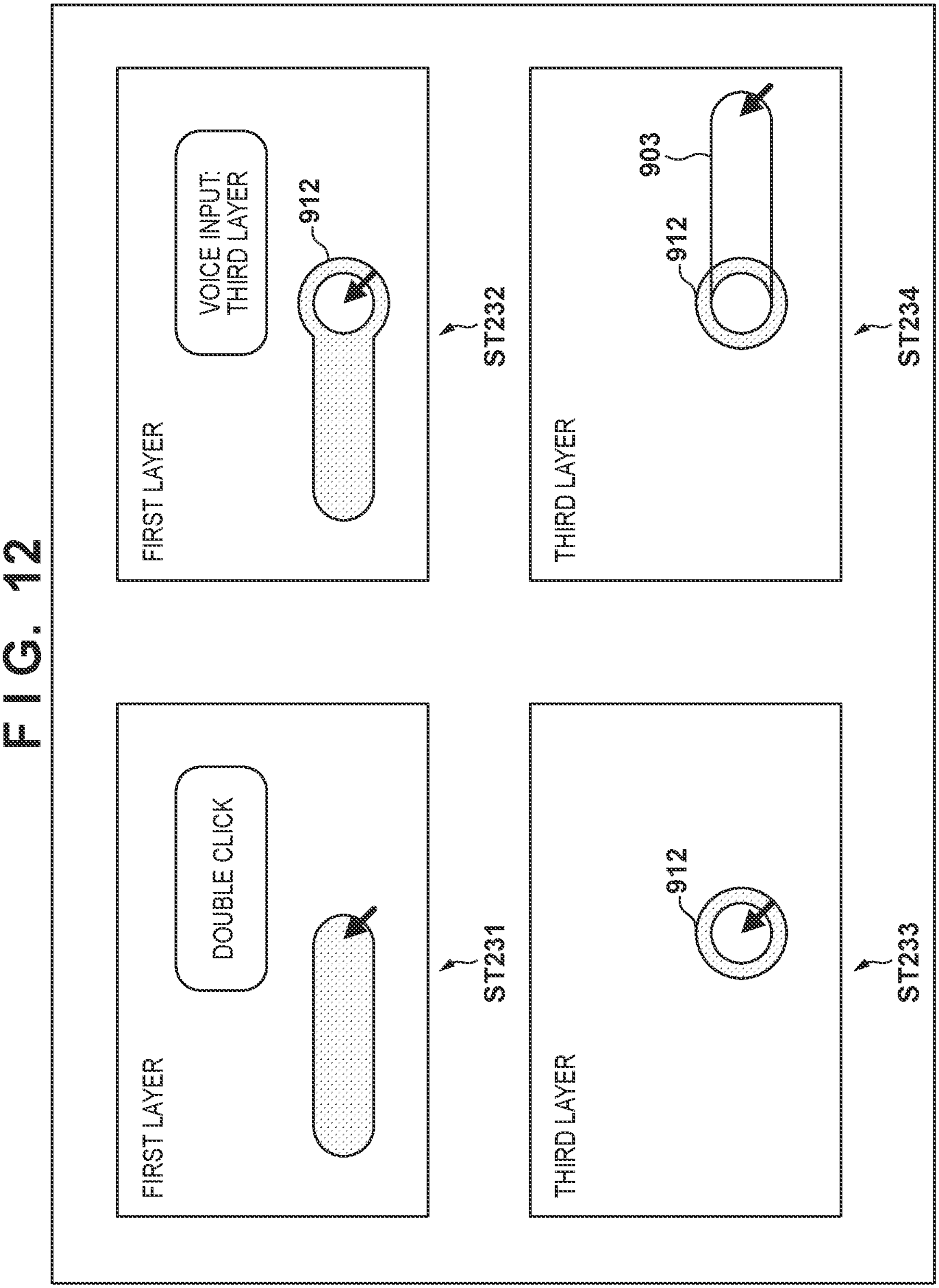
FIG. 12 is a view showing an editing work for generating a conductive path in accordance with input of a wiring command that instructs the start of generation of a conductive path.

In step S504, the editing unit 26 updates the conductive path such that the conductive path is connected from the current layer, through a via, to the layer designated by the second command. That is, in a case where the layer change command is input, and the layer of the destination is designated by the second command, the editing unit 26 updates the conductive path such that the conductive path is connected from the current layer, through a via, to the layer designated by the second command. This processing is shown in FIG. 12 to be described later. After that, the editing unit 26 returns to step S301 of FIG. 3.

In step S505, the editing unit 26 judges whether the latest first command is an appropriate command for the continuing command. In a case where the latest first command is an appropriate command, in step S506, the editing unit 26 executes the latest command. On the other hand, in a case where the latest first command is an inappropriate command for the continuing command, in step S507, the editing unit 26 can cancel the continuing first command and execute the latest first command.

The second command that can be executed in step S409 of FIG. 4 can include a cancel command that cancels an already executed command. The cancel command can include a section erase command that erases the latest section of a plurality of sections in a case where the conductive path is formed by a plurality of sections (linear paths).

The cancel command may include a whole section erase command that erases all a plurality of sections in a case where the conductive path is formed by a plurality of sections. The whole section erase command may not cancel a command (the above-described path editing command) that starts generation of a conductive path. For example, the first command that points in an editing screen immediately after the whole section erase command can be recognized as the start point of a new conductive path.

The cancel command may include a command cancel command that cancels a command that instructs the start of generation of a conductive path.

An editing work for generating a conductive path in accordance with input of a path editing command that instructs the start of generation of a conductive path will exemplarily be described with reference to FIG. 7. Display shown in FIG. 7 schematically represents an electric circuit displayed on the editing screen of the display 30. The conductive path can be formed by one or a plurality of linear paths (sections). In FIG. 7, black circles schematically represent the start points and/or the end points of the plurality of linear paths that form the conductive path. Also, in FIG. 7, an arrow indicates a cursor (pointer).

In step ST101, a second linear path 702 whose start point is the end point of a first linear path 711 that forms the conductive path under editing is temporarily displayed. The second linear path 702 is not determined yet.

In step ST102, the width of a third linear path 703 is designated by a width designation command that is the second command generated by the second converter 24 in accordance with a voice signal. By inputting the width designation command (in this example, the width designation command that instructs to set the width to 0.75 μm), the second linear path 702 is determined as a second linear path 712. This means that an end point PE2 of the second linear path 712 is determined. The end point PE2 can be a start point PS3 of the new third linear path 703 having the width designated by the width designation command. In this case, as the new start point PS3, the new third linear path 703 having the width (0.75 μm) designated by the width designation command can begin to be drawn in accordance with the first command generated by the first converter 22 in accordance with the operation of the pointing device 12.

An editing work for generating a conductive path in accordance with input of a path editing command that instructs the start of generation of a conductive path will exemplarily be described with reference to FIG. 8. Display shown in FIG. 8 schematically represents an electric circuit displayed on the editing screen of the display 30. The conductive path can be formed by one or a plurality of linear paths (sections). In FIG. 8, black circles schematically represent the start points and/or the end points of the plurality of linear paths that form the conductive path. Also, in FIG. 8, an arrow indicates a cursor (pointer).

In step ST111, the second linear path 702 whose start point is the end point of the first linear path 711 that forms the conductive path under editing is temporarily displayed. The second linear path 702 is not determined yet.

In step ST112, the second linear path 702 is determined as the second linear path 712 by the first command generated by the first converter 22 in accordance with the operation of the pointing device 12 (in this example, click). This means that the end point PE2 of the second linear path 712 is determined. The end point PE2 can be the start point PS3 of the new third linear path 703.

In step ST113, the width of the third linear path 703 is designated by a width designation command that is the second command generated by the second converter 24 in accordance with a voice signal. By inputting the width designation command (in this example, the width designation command that instructs to set the width to 0.75 μm), the width of the third linear path 703 is designated to the width (0.75 μm) designated by the width designation command.

An editing work for generating a conductive path in accordance with input of a path editing command that instructs the start of generation of a conductive path will exemplarily be described with reference to FIG. 9. Display shown in FIG. 9 schematically represents an electric circuit displayed on the editing screen of the display 30. The conductive path can be formed by one or a plurality of linear paths (sections). In FIG. 9, an arrow indicates a cursor (pointer).

In step ST201, in a state in which the conductive path is being edited, a layer change command is input as the second command generated by the second converter 24 in accordance with a voice signal. Here, a linear path 911 (in other words, the end point of the linear path 911) under editing may be determined in accordance with the input of the layer change command. Alternatively, the layer change command may be input as the second command after the linear path 911 (in other words, the end point of the linear path 911) under editing is determined in accordance with the first command or the like.

In step ST202, the editing unit 26 generates a via 912 in accordance with the layer change command input in step ST201, and updates the conductive path such that the conductive path is connected from the current layer (in this example, the first layer), through the via 912, to another layer (see FIG. 6) set by the setting unit 28.

In step ST203, the editing unit 26 changes the operation of the editing target to the layer of the connection destination of the via 912 (in this example, the fifth layer). In step ST204, the editing unit 26 starts drawing a new linear path 903 extending from the via 912 in accordance with the first command generated by the first converter 22 in accordance with the operation of the pointing device 12.

An editing work for generating a conductive path in accordance with input of a path editing command that instructs the start of generation of a conductive path will exemplarily be described with reference to FIG. 10. Display shown in FIG. 10 schematically represents an electric circuit displayed on the editing screen of the display 30. The conductive path can be formed by one or a plurality of linear paths (sections). In FIG. 10, an arrow indicates a cursor (pointer).

In step ST211, in a state in which the conductive path is being edited, a layer designation command is input as the second command generated by the second converter 24 in accordance with a voice signal. Here, the linear path 911 (in other words, the end point of the linear path 911) under editing may be determined in accordance with the input of the layer designation command. Alternatively, the layer designation command may be input as the second command after the linear path 911 (in other words, the end point of the linear path 911) under editing is determined in accordance with the first command or the like. In this example, the layer designation command that designates a layer (here, the third layer) other than the first layer is input during editing of the first layer.

In step ST212, the editing unit 26 generates the via 912 in accordance with the layer designation command input in step ST211, and updates the conductive path such that the conductive path is connected from the current layer (in this example, the first layer), through the via 912, to the layer (in this example, the third layer) designated by the layer designation command.

In step ST213, the editing unit 26 changes the operation of the editing target to the layer of the connection destination of the via 912 (in this example, the fifth layer). In step ST214, the editing unit 26 starts drawing the new linear path 903 extending from the via 912 in accordance with the first command generated by the first converter 22 in accordance with the operation of the pointing device 12.

An editing work for generating a conductive path in accordance with input of a path editing command that instructs the start of generation of a conductive path will exemplarily be described with reference to FIG. 11. Display shown in FIG. 11 schematically represents an electric circuit displayed on the editing screen of the display 30. The conductive path can be formed by one or a plurality of linear paths (sections). In FIG. 11, an arrow indicates a cursor (pointer).

In step ST221, in a state in which the conductive path is being edited, a layer change command is input as the first command generated by the first converter 22 in accordance with the operation of the pointing device 12 or the keyboard 10. Here, the linear path 911 (in other words, the end point of the linear path 911) under editing may be determined in accordance with the input of the layer change command. Alternatively, the layer change command may be input as the first command after the linear path 911 (in other words, the end point of the linear path 911) under editing is determined in accordance with the first command or the like.

In step ST222, the editing unit 26 generates the via 912 in accordance with the layer change command input in step ST221, and updates the conductive path such that the conductive path is connected from the current layer (in this example, the first layer), through the via 912, to another layer (see FIG. 6) set by the setting unit 28.

In step ST223, the editing unit 26 changes the operation of the editing target to the layer of the connection destination of the via 912 (in this example, the fifth layer). In step ST224, the editing unit 26 starts drawing the new linear path

903 extending from the via 912 in accordance with the first command generated by the first converter 22 in accordance with the operation of the pointing device 12.

An editing work for generating a conductive path in accordance with input of a path editing command that instructs the start of generation of a conductive path will exemplarily be described with reference to FIG. 12. Display shown in FIG. 12 schematically represents an electric circuit displayed on the editing screen of the display 30. The conductive path can be formed by one or a plurality of linear paths (sections). In FIG. 12, an arrow indicates a cursor (pointer).

In step ST231, in a state in which the conductive path is being edited, a layer change command is input as the first command generated by the first converter 22 in accordance with the operation of the pointing device 12 or the keyboard 10. Here, the linear path 911 (in other words, the end point of the linear path 911) under editing may be determined in accordance with the input of the layer change command. Alternatively, the layer change command may be input as the first command after the linear path 911 (in other words, the end point of the linear path 911) under editing is determined in accordance with the first command or the like.

In step ST232, a layer designation command is input as the second command generated by the second converter 24 in accordance with a voice signal. The editing unit 26 generates the via 912 in accordance with the layer designation command, and updates the conductive path such that the conductive path is connected from the current layer (in this example, the first layer), through the via 912, to the layer (in this example, the third layer) designated by the layer designation command.

In step ST233, the editing unit 26 changes the operation of the editing target to the layer of the connection destination of the via 912 (in this example, the third layer). In step ST234, the editing unit 26 starts drawing the new linear path 903 extending from the via 912 in accordance with the first command generated by the first converter 22 in accordance with the operation of the pointing device 12.

Figure 13:
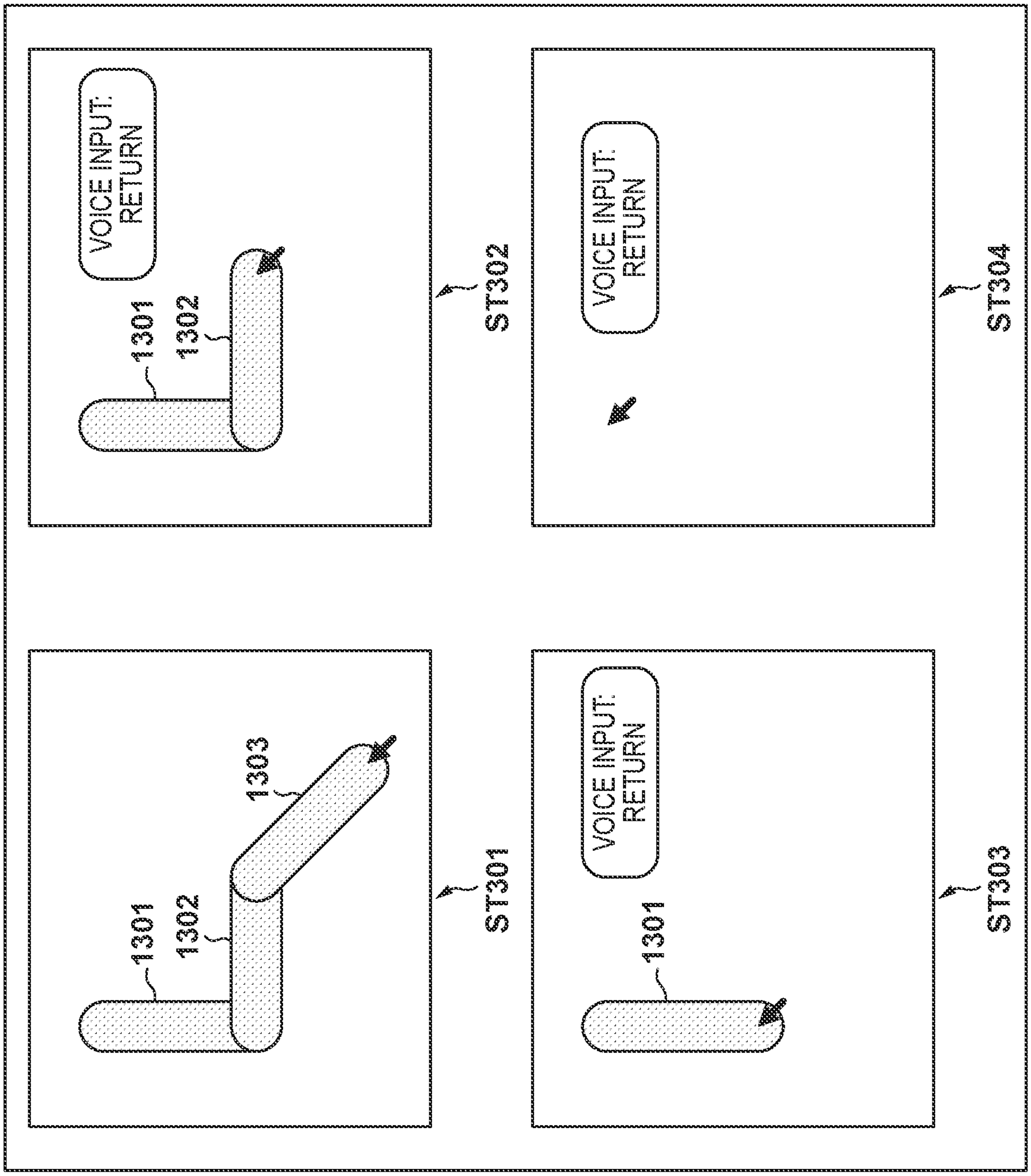
FIG. 13 is a view showing an operation according to a cancel command that is a second command.

An operation according to a cancel command that is the second command will exemplarily be described with reference to FIG. 13. In the example shown in FIG. 13, the cancel command can include a section erase command that erases the latest section of a plurality of sections 1301, 1302, and 1303 in a case where the conductive path is formed by the plurality of sections (linear paths) 1301, 1302, and 1303.

In step ST301, the plurality of sections 1301, 1302, and 1303 are determined. In step ST302, the editing unit 26 erases the latest section 1303 of the plurality of determined sections 1301, 1302, and 1303 in accordance with the section erase command that is the second command generated by the second converter 24 in accordance with a voice signal. In step ST303, the editing unit 26 erases the latest section 1302 of the plurality of determined sections 1301 and 1302 in accordance with the section erase command that is the second command. In step ST304, the editing unit 26 erases the latest determined section 1301 in accordance with the section erase command that is the second command.

Figure 14:
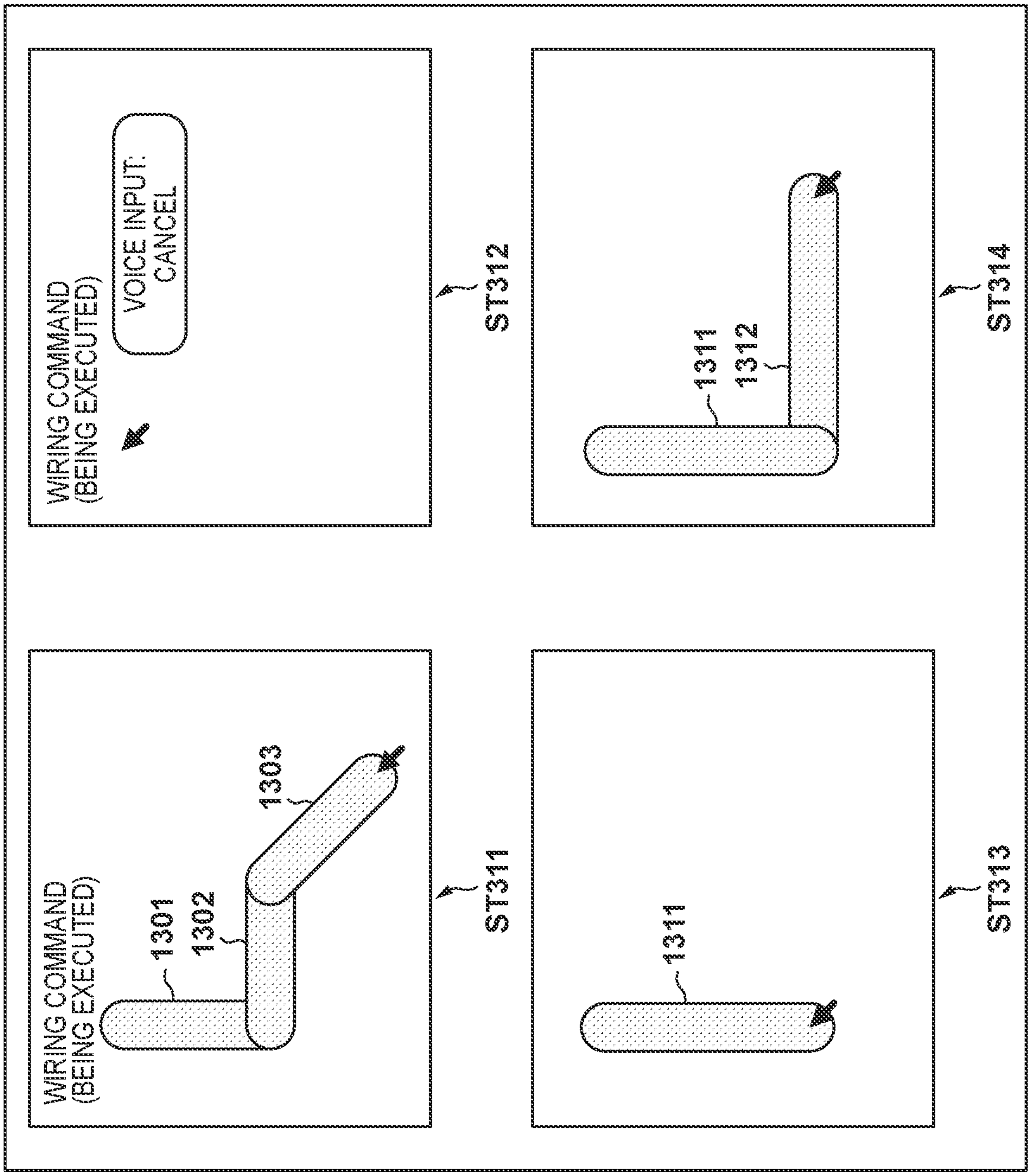
FIG. 14 is a view showing an operation according to a cancel command that is a second command.

An operation according to a cancel command that is the second command will exemplarily be described with reference to FIG. 14. In the example shown in FIG. 14, the cancel command is a whole section erase command that erases all the plurality of sections 1301, 1302, and 1303 in a case where the conductive path is formed by the plurality of sections (linear paths) 1301, 1302, and 1303. The section erase command may not cancel a command (wiring command) that instructs the start of generation of a conductive path. For example, the first command that points in the editing screen immediately after the whole section erase command can be recognized as the start point of a new conductive path.

In step ST311, the plurality of sections 1301, 1302, and 1303 are determined. In step ST312, the editing unit 26 erases all the plurality of determined sections 1301, 1302, and 1303 in accordance with the whole section erase command that is the second command generated by the second converter 24 in accordance with a voice signal. On the other hand, the editing unit 26 does not cancel a command (wiring command) that instructs the start of generation of a conductive path. Hence, the next command can be handled as an input for deciding the start point of a first linear path 1311. Hence, the first command that points in the editing screen immediately after the whole section erase command can be recognized as the start point of a new conductive path.

In step ST313, the editing unit 26 can generate or determine the first linear path 1311 after the whole section erase command in accordance with the first command generated by the first converter 22 in accordance with the operation of the pointing device 12. In step ST314, the editing unit 26 can generate or determine a second linear path following the first linear path 1311 in accordance with the first command generated by the first converter 22 in accordance with the operation of the pointing device 12.

Figure 15:
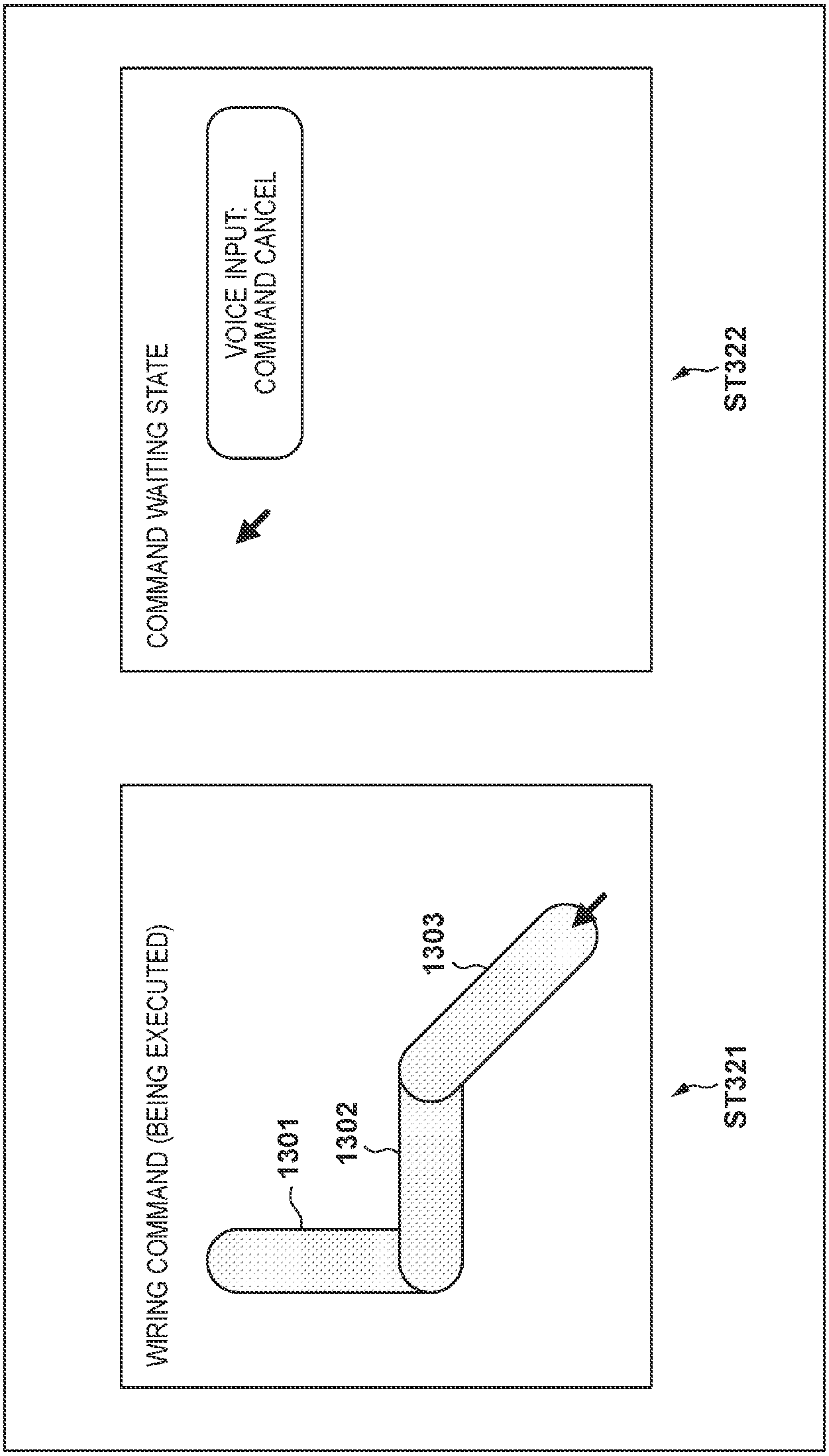
FIG. 15 is a view showing an operation according to a cancel command that is a second command.

An operation according to a cancel command that is the second command will exemplarily be described with reference to FIG. 15. In the example shown in FIG. 15, the cancel command includes a command cancel command that cancels a command (wiring command) that instructs the start of generation of a conductive path. In step ST321, the plurality of sections 1301, 1302, and 1303 are determined. In step ST322, the editing unit 26 erases all the plurality of determined sections 1301, 1302, and 1303 and cancels the wiring command in accordance with the command cancel command that is the second command generated by the second converter 24 in accordance with a voice signal. Hence, the editing unit 26 transitions to a state for waiting for input of the next editing command such as a wiring command or an arrangement command.

The second command generated by the second converter 24 in accordance with a voice signal is not limited to the above-described examples. The second command may be, for example, a command for searching for, inputting, or changing a name such as a signal name, an element name, a circuit symbol name, or a terminal name. The second command may include, for example, a command for instructing a setting such as ON (display)/OFF (non-display) of a grid, lock/unlock of a wiring angle, or ON/OFF of a real-time DRC.

The second command may include a command for instructing a window operation such as enlargement/reduction of an editing target region of a visualized electric circuit or scroll in the horizontal and vertical directions.

The invention is not limited to the foregoing embodiments, and various variations/changes are possible within the spirit of the invention.

What is claimed is:

1. An editing support apparatus for supporting editing of an electric circuit, comprising:

a first converter configured to convert an operation on a contact type input device into a first command;

a second converter configured to convert a voice signal into a second command; and an editing unit configured to update the electric circuit in accordance with the first command and the second command, wherein when a width designation command that designates a width of a conductive path that forms a part of the electric circuit is provided as the second command from the second converter in a state in which a linear path forming the conductive path is drawn with a certain width from a start point, the editing unit determines an end point of the linear path and sets the end point to a start point of a new linear path having the width designated by the width designation command.

2. The editing support apparatus according to claim 1, wherein the editing unit draws the linear path forming the conductive path in accordance with the first command.

3. The editing support apparatus according to claim 1, wherein in a case where the conductive path is being edited, and a layer change command that instructs layer change for connecting the conductive path from a current layer to another layer through a via is input, the editing unit updates the conductive path such that the conductive path is connected from the current layer, through a via, to a layer designated by the second command.

4. The editing support apparatus according to claim 3, wherein the layer change command is one of a plurality of first commands.

5. The editing support apparatus according to claim 4, wherein the contact type input device includes a pointing device, and the layer change command that is one of the first commands is generated in accordance with a double click on the pointing device.

6. The editing support apparatus according to claim 3, wherein the layer change command is one of a plurality of second commands.

7. The editing support apparatus according to claim 1, further comprising a setting unit configured to, when executing a layer change command that instructs layer change for connecting the conductive path from a current layer to another layer through a via, set the other layer, wherein in a case where the layer change command is input, the editing unit updates the conductive path such that the conductive path is connected from the current layer, through a via, to the other layer set by the setting unit.

8. The editing support apparatus according to claim 1, wherein in a case where the conductive path is being edited, and the second command is a layer designation command that designates a layer different from a current layer, the editing unit updates the conductive path such that the conductive path is connected from the current layer, through a via, to the layer designated by the layer designation command.

9. The editing support apparatus according to claim 1, wherein the second command includes a cancel command that cancels an already executed command.

10. The editing support apparatus according to claim 9, wherein the cancel command includes a section erase command that erases a latest section of a plurality of sections in a case where the conductive path is formed by the plurality of sections.

11. The editing support apparatus according to claim 9, wherein the cancel command includes a whole section erase command that erases all the plurality of sections in a case where the conductive path is formed by the plurality of sections.

12. The editing support apparatus according to claim 11, wherein the whole section erase command does not cancel a command that instructs a start of generation of the conductive path.

13. The editing support apparatus according to claim 12, wherein the first command that points in an editing screen immediately after the whole section erase command is recognized as a start point of a new conductive path.

14. The editing support apparatus according to claim 9, wherein the cancel command includes a command cancel command that cancels the command that instructs the start of generation of the conductive path.

15. A non-transitory computer-readable medium storing a computer program configured to cause a computer to operate as an editing support apparatus defined in claim 1.

16. The editing support apparatus according to claim 1, wherein in a case where the conductive path is being edited, and a layer change command that instructs layer change for connecting the conductive path from a current layer to another layer through a via is input, the editing unit updates the conductive path such that the conductive path is connected from the current layer, through a via, to another layer, in a case where the other layer is designated by the second command, the editing unit connects the conductive path from the current layer, through the via, to the other layer designated by the second command, and in a case where the other layer is not designated by the second command, the editing unit updates the conductive path such that the conductive path is connected from the current layer, through the via, to a layer that is set in advance as the other layer.

17. An editing support method for supporting editing of an electric circuit, comprising:

a command receiving step of receiving a first command from a first converter configured to convert an operation on a contact type input device into the first command and receiving a second command from a second converter configured to convert a voice into the second command; and an updating step of updating the electric circuit in accordance with the first command and the second command, wherein in the updating step, when editing a conductive path that forms a part of the electric circuit, the conductive path is updated in accordance with the second command provided from the second converter, in the updating step, in a case where the conductive path is being edited, and a layer change command that instructs layer change for connecting the conductive path from a current layer to another layer through a via is input, the conductive path is updated such that the conductive path is connected from the current layer, through a via, to another layer, in the updating step, in a case where the other layer is designated by the second command, the conductive path is connected from the current layer, through the via, to the other layer designated by the second command, and in the updating step, in a case where the other layer is not designated by the second command, the conductive path is updated such that the conductive path is connected from the current layer, through the via, to a layer that is set in advance as the other layer.

18. An editing support apparatus for supporting editing of an electric circuit, comprising:

a first converter configured to convert an operation on a contact type input device into a first command;

a second converter configured to convert a voice signal into a second command; and an editing unit configured to update the electric circuit in accordance with the first command and the second command, wherein the editing unit updates a conductive path that forms a part of the electric circuit in accordance with the second command provided from the second converter when editing the conductive path, in a case where the conductive path is being edited, and a layer change command that instructs layer change for connecting the conductive path from a current layer to another layer through a via is input, the editing unit updates the conductive path such that the conductive path is connected from the current layer, through a via, to another layer, in a case where the other layer is designated by the second command, the editing unit connects the conductive path from the current layer, through the via, to the other layer designated by the second command, and in a case where the other layer is not designated by the second command, the editing unit updates the conductive path such that the conductive path is connected from the current layer, through the via, to a layer that is set in advance as the other layer.

19. A non-transitory computer-readable medium storing a computer program configured to cause a computer to operate as an editing support apparatus defined in claim 18.

20. An editing support method for supporting editing of an electric circuit, comprising:

a command receiving step of receiving a first command from a first converter configured to convert an operation on a contact type input device into the first command and receiving a second command from a second converter configured to convert a voice into the second command; and an updating step of updating the electric circuit in accordance with the first command and the second command, wherein in the updating step, when a width designation command that designates a width of a conductive path that forms a part of the electric circuit is provided as the second command from the second converter in a state in which a linear path forming the conductive path is drawn with a certain width from a start point, an end point of the linear path is determined and the end point is set to a start point of a new linear path having the width designated by the width designation command.

* * * * *